(12) United States Patent
Saito et al.

(10) Patent No.: US 11,258,233 B2
(45) Date of Patent: Feb. 22, 2022

(54) QUANTUM CASCADE LASER

(71) Applicant: Kabushiki Kaisha Toshiba, Minato-ku (JP)

(72) Inventors: Shinji Saito, Yokohama (JP); Tsutomu Kakuno, Fujisawa (JP); Rei Hashimoto, Edogawa (JP); Kei Kaneko, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/855,428

(22) Filed: Dec. 27, 2017

(65) Prior Publication Data
US 2019/0199065 A1 Jun. 27, 2019

(51) Int. Cl.
| | | |
|---|---|---|
| *H01S 5/34* | (2006.01) | |
| *H01S 5/32* | (2006.01) | |
| *H01S 5/12* | (2021.01) | |
| *H01S 5/20* | (2006.01) | |
| *H01S 5/042* | (2006.01) | |

(52) U.S. Cl.
CPC ............ *H01S 5/3402* (2013.01); *H01S 5/12* (2013.01); *H01S 5/2031* (2013.01); *H01S 5/3215* (2013.01); *H01S 5/0421* (2013.01)

(58) Field of Classification Search
CPC .... H01S 5/3402; H01S 5/3419; H01S 5/2031; H01S 5/3401; H01S 5/3418; H01S 5/3409
See application file for complete search history.

(56) References Cited

U.S. PATENT DOCUMENTS

| | | | |
|---|---|---|---|
| 5,457,709 A | 10/1995 | Capasso et al. | |
| 5,509,025 A * | 4/1996 | Capasso ................. | B82Y 20/00 372/45.012 |
| 5,570,386 A | 10/1996 | Capasso et al. | |
| 2004/0066823 A1 | 4/2004 | Capasso et al. | |
| 2004/0161006 A1 | 8/2004 | Chang et al. | |
| 2004/0247009 A1 | 12/2004 | Noda et al. | |

(Continued)

FOREIGN PATENT DOCUMENTS

| | | |
|---|---|---|
| JP | 8-279647 | 10/1996 |
| JP | 2003-23193 | 1/2003 |

(Continued)

*Primary Examiner* — Tod T Van Roy
(74) *Attorney, Agent, or Firm* — Oblon, McClelland, Maier & Neustadt, L.L.P.

(57) ABSTRACT

A quantum cascade laser has an active layer, a first and second cladding layer, and an optical guide layer. The active layer has a plurality of injection quantum well regions and a plurality of light-emitting quantum well regions. The each of the injection quantum well regions and the each of the light-emitting quantum well regions are alternatively stacked. The first and second cladding layers are provided to interpose the active layer from both sides, and have a refractive index lower than an effective refractive index of the each of the light-emitting quantum well regions. The optical guide layer is disposed to divide the active layer into two parts. The optical guide layer has a refractive index higher than the effective refractive index of the each of the light-emitting quantum well regions, and has a thickness greater than the thickness of all well layers of quantum well layers.

7 Claims, 7 Drawing Sheets

(56) References Cited

U.S. PATENT DOCUMENTS

| | | | |
|---|---|---|---|
| 2007/0008999 A1* | 1/2007 | Breznay | B82Y 20/00 372/45.01 |
| 2009/0279579 A1 | 11/2009 | Ohnishi et al. | |
| 2013/0195136 A1 | 8/2013 | Takagi et al. | |
| 2015/0053922 A1 | 2/2015 | Nakajima et al. | |
| 2016/0020581 A1 | 1/2016 | Hirose et al. | |
| 2016/0294161 A1* | 10/2016 | Takagi | H01S 5/2054 |
| 2018/0006434 A1* | 1/2018 | Yabuhara | H01S 5/3401 |

FOREIGN PATENT DOCUMENTS

| | | |
|---|---|---|
| JP | 2004-253801 | 9/2004 |
| JP | 2006-156901 | 6/2006 |
| JP | 2009-231773 | 10/2009 |
| JP | 2009-295904 | 12/2009 |
| JP | 2010-98135 | 4/2010 |
| JP | 2010-238711 | 10/2010 |
| JP | 2010-278326 | 12/2010 |
| JP | 2011-108935 | 6/2011 |
| JP | 2013-77756 | 4/2013 |
| JP | WO 2013/172269 A1 | 11/2013 |
| JP | 2015-173195 A | 10/2015 |
| JP | 2018-93023 | 6/2018 |
| WO | WO 2007/029538 A1 | 3/2007 |
| WO | WO 2014/136653 A1 | 9/2014 |
| WO | WO 2016/031965 A1 | 3/2016 |

\* cited by examiner

QUANTUM CASCADE LASER

FIELD

The embodiment of the invention relates to a quantum cascade laser.

BACKGROUND

A quantum cascade laser (QCL) emits infrared laser light.

When a threshold electric current of a quantum cascade laser is reduced, the quantum efficiency or light output can be raised.

However, quantum cascade lasers have an active layer in which a large number of light-emitting quantum well regions are cascade-connected thereon. Therefore, it cannot be said that optical confinement is sufficient in the direction perpendicular to a thick active layer, and it is not easy to reduce the threshold electric current.

DETAILED DESCRIPTION

In general, according to one embodiment, a quantum cascade laser of the embodiment has an active layer, a first and second cladding layer, and an optical guide layer. The active layer has a plurality of injection quantum well regions and a plurality of light-emitting quantum well regions. The each of the injection quantum well regions and the each of the light-emitting quantum well regions are alternatively stacked. The each of the light-emitting quantum well regions emit laser light by optical transition between sub-bands of a carrier. The each of the injection quantum well regions mitigate the carrier after optical transition between sub-bands to a mini-band level, and inject the carrier into the light-emitting quantum well region which is downstream. The first and second cladding layers are provided to interpose the active layer from both sides, and have a refractive index lower than an effective refractive index of the each of the light-emitting quantum well regions. The optical guide layer is disposed to divide the active layer into two parts in a stacking direction. The optical guide layer has a refractive index higher than the effective refractive index of the each of the light-emitting quantum well regions, and has a thickness greater than the thickness of all well layers of quantum well layers of each of the light-emitting quantum well regions.

Hereinafter, embodiments of the invention will be described below with reference to drawings.

Figure 1A:
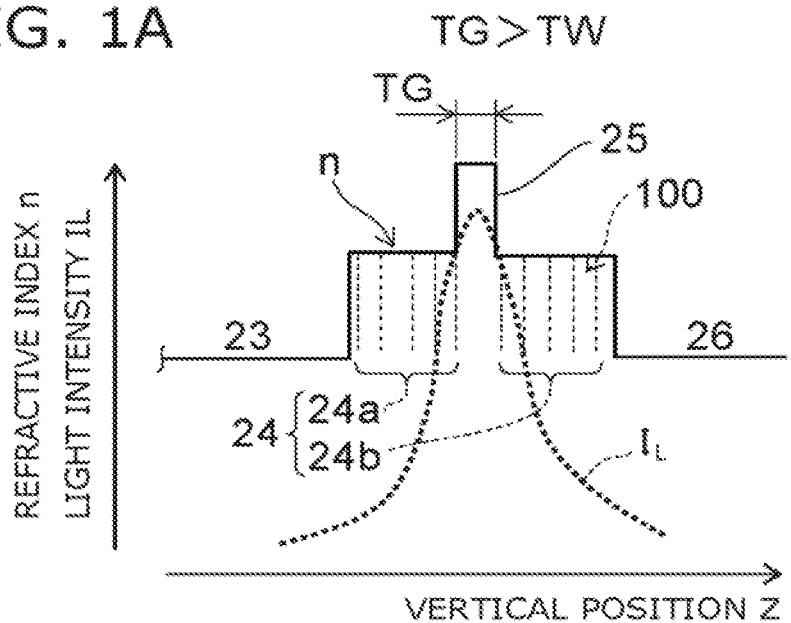
FIG. 1A is a graph for describing light confinement in a vertical direction of the quantum cascade laser according to the first embodiment.
Figure 1B:
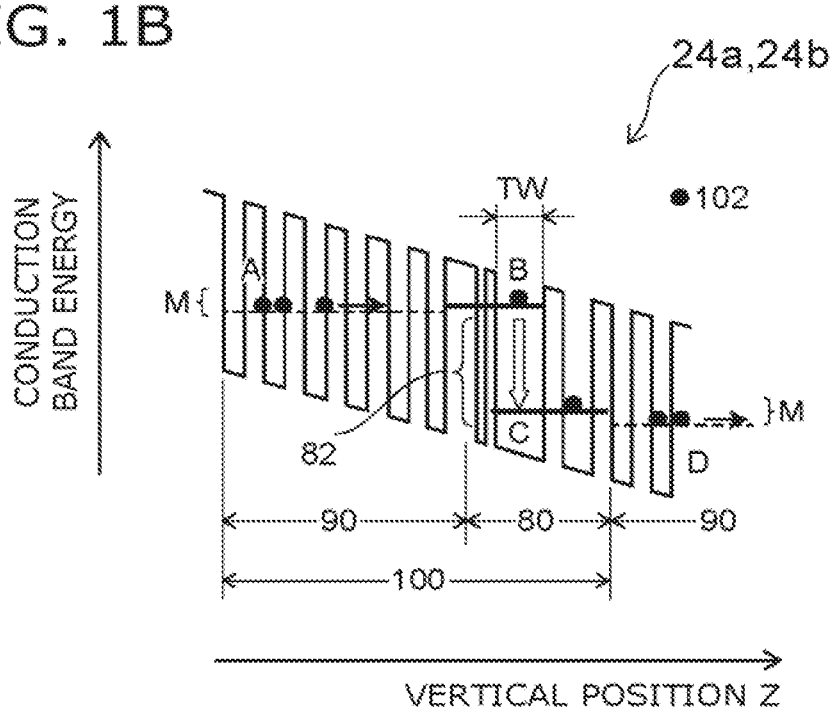
FIG. 1B is a graph showing the energy level of a conduction band.

FIG. 1A is a graph for describing light confinement in a direction perpendicular to the active layer of the quantum cascade laser according to the first embodiment, and FIG. 1B is a graph showing the energy level of a conduction band.

In FIG. 1A, the vertical axis shows a refractive index n (solid line) and light intensity $I_L$ (dotted line), and the horizontal axis Z shows the vertical (stacking direction) position of a semiconductor layer. As shown in FIG. 1A, the quantum cascade laser of the first embodiment has an active layer 24 (24a, 24b), a first cladding layer 23, a second cladding layer 26, and an optical guide layer 25.

In FIG. 1B, the vertical axis shows a conduction band energy level, and the horizontal axis Z shows a vertical position. As shown in FIG. 1B, the active layer 24 has a plurality of injection quantum well regions 90 and a plurality of light-emitting quantum well regions 80. The active layer 24 includes a stacked body having each injection quantum well region 90 and each light-emitting quantum well region 80 alternatively stacked thereon. That is, a unit stacked body 100 is arranged, including a pair of one injection quantum well region 90 and one light-emitting quantum well region 80. That is, each of the regions interposed by the broken lines in FIG. 1(a) corresponds to the unit stacked body 100.

The number arranged is, for example, 30 to 200 or the like. Each light-emitting quantum well region 80 emits laser light by optical transition between sub-bands of a carrier 102 such as an electron. Furthermore, each injection quantum well region 90 mitigates the carrier 102 after optical transition between sub-bands to a mini-band level M, and injects it into the light-emitting quantum well region 80 which is downstream. As shown in FIG. 1B, when the carrier 102 is an electron, the electron is mitigated at a mini-band M of the injection quantum well region 90 (level A→B), emits laser light by transition between sub-bands in the light-emitting quantum well region 80 (level B→C), and is mitigated after being injected into the injection quantum well region 90 which is downstream (level D).

The optical guide layer 25 has a refractive index higher than the effective refractive index of each light-emitting quantum well region 80. The thickness of a well layer and thickness of a barrier layer of the light-emitting quantum well region 80 are sufficiently shorter than the wavelength of the laser light. Therefore, the effective refractive index of the light-emitting quantum well regions 80 is considered such that the medium, which is an intermediary refractive index between the refractive index of the well layer and the refractive index of the barrier layer that is lower than the refractive index of the well layer, is uniformly dispersed. Generally, a substance having a higher refractive index tends to have a lower band gap energy Eg. Even in this system, the band gap energy of the optical guide layer 25 may be lower than the band gap energy of the quantum well layer. In a pn-junction laser diode, a substance having a small band gap energy Eg becomes a light-absorbing layer, so there is no optical guide layer provided on the central portion of the active layer. However, quantum cascade lasers emit light at a lower energy than band gap energy, so light absorption is suppressed even if a substance having a high refractive index is provided on the central portion of the active layer 25.

It is favorable for the optical guide layer 25 to not include quantum wells that generate optical transition between bands. Therefore, the optical guide layer 25 has a thickness TG, which is respectively larger than the thickness of all of the well layers from among the quantum well layers of each light-emitting quantum well region 80. Note that in FIG. 1B, one light-emitting quantum well region 80 has two quantum well layers, and when the thickness of the larger well layer is expressed as TW: TG>TW. Note that if the thickness TG of the optical guide layer 25 is 100 nm or greater, the light confinement effect can be raised, as described using a simulation hereinafter. On the other hand, if the active layer 24a and the active layer 24b are separated too much, the optical feedback effect is lessened. Therefore, it is favorable for the thickness TG of the optical guide layer 25 to be 500 nm or less.

Moreover, it is favorable for the optical guide layer 25 to be provided to divide the active layer 24 into two substantially equal parts because this makes it so that the light intensity distribution can be close to symmetrical. For example, if the number of cascade-connected unit stacked bodies 100 is an even number, the optical guide layer 25 may be provided to divide the stacked number of unit stacked bodies 100 into two equal parts. Furthermore, if the stacked number of unit stacked bodies 100 is an odd number, one of the sides becomes slightly larger. However, because the stacked number of unit stacked bodies 100 is large at 30 to 200 or the like, it does not strictly need to be divided in two.

The first cladding layer 23 and the second cladding layer 26 are provided to interpose the active layer 24 from both sides. The refractive index of the first and second cladding layers 23 and 26 is lower than the effective refractive index of each light-emitting quantum well region.

In the first embodiment, the light confinement effect can be strengthened by disposing the optical guide layer 25 around the vicinity of the central portion of the active layer 24. Therefore, the threshold electric current is reduced, and the quantum efficiency and light output can be raised.

Figure 2A:
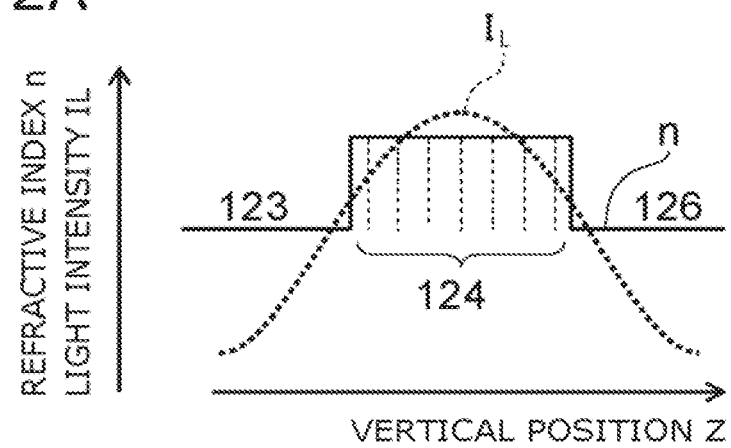
FIG. 2A is a graph for describing light confinement in a vertical direction of the quantum cascade laser according to a first comparative example.
Figure 2B:
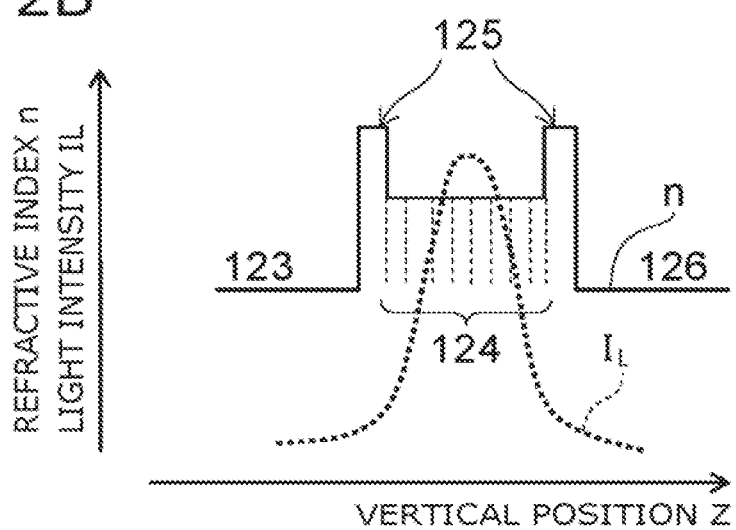
FIG. 2B is a graph for describing light confinement in a vertical direction of the quantum cascade laser according to a second comparative example.

FIG. 2A is a graph for describing the light confinement effect in a direction perpendicular to the active layer of the quantum cascade laser according to a first comparative example, and FIG. 2B is a graph for describing the light confinement effect in a direction perpendicular to the active layer of the quantum cascade laser according to a second comparative example.

In FIGS. 2A and 2B, the vertical axis is the refractive index n and light intensity $I_L$, and the horizontal axis is the vertical position Z. In the quantum cascade laser of the first comparative example shown in FIG. 2A, an active layer 124 is interposed by a first cladding layer 123 and a second cladding layer 126, and an optical guide layer having an effective refractive index higher than the refractive index of the injection quantum well region and the refractive index of the light-emitting quantum well region is not provided. Therefore, the light confinement effect is weak, and the distribution of light intensity $I_L$ expands to within the active layer 124. Because of this, the threshold electric current cannot be reduced, and it is difficult to achieve high output.

In the quantum cascade laser of the second comparative example shown in FIG. 2B, a optical guide layer 125 having a refractive index higher than the effective refractive index of each of the light-emitting quantum well regions is provided between the active layer 124 and the first cladding later 123, and between the active layer 124 and the second cladding layer 126. Because the optical guide layer 125 is provided, the light confinement effect can be strengthened more than in the first comparative example, but the light confinement effect is less than in the first embodiment, wherein the optical guide layer 125 is disposed in the central portion. Note that the light confinement effect will be described in detail later using the simulation results.

Figure 3A:
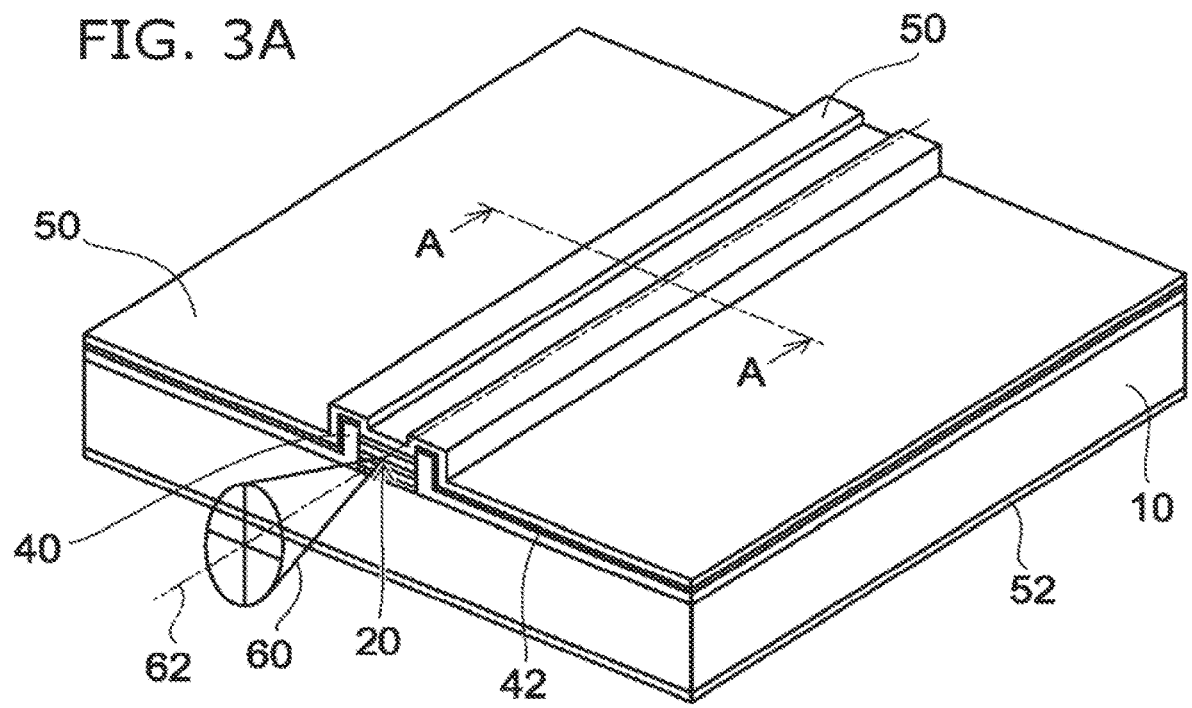
FIG. 3A is a schematic perspective view of the quantum cascade laser according to the first embodiment.
Figure 3B:
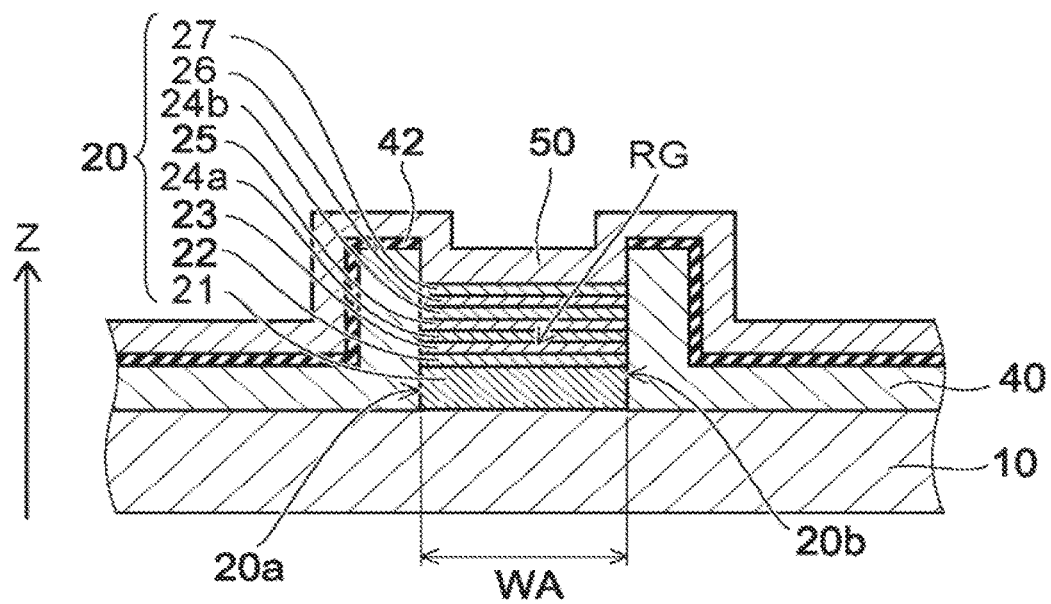
FIG. 3B is a schematic cross-sectional view along the A-A line.

FIG. 3A is a schematic perspective view of the quantum cascade laser according to the first embodiment, and FIG. 3B is a schematic cross-sectional view along the A-A line.

The quantum cascade laser can further have a substrate 10, and a stacked body 20 is further provided, crystal grown using a metal organic chemical vapor deposition (MOCVD) method or a molecular beam epitaxy (MBE) method. The stacked body 20 is processed by a stripe-shaped ridge wave guide RG. Additionally, dielectric layers 40 and 42 are provided to cover the substrate 10 and the stacked body 20. The dielectric layers 40 and 42 are opened so that the upper surface of the stacked body 20 is exposed, and a first electrode 50 is provided. Furthermore, a second electrode 52 is provided on the back surface of the substrate 10.

A width WA of the ridge waveguide RG is, for example, 10 to 50 μm or the like. Note that in FIG. 3B, a cross-section of the ridge waveguide RG is shown by rectangles having side surfaces 20a and 20b. However, the shape of the ridge waveguide RG is not limited to this, and may be mesa-shaped.

The stacked body 20 has a foundation layer 21, a contact layer 22, the first cladding layer 23, the active layer 24a, the optical guide layer 25, the active layer 24b, the second cladding layer 26, and a contact layer 27, in this order from the side of the substrate 10.

As illustrated in FIG. 3A, laser light 60 having an infrared/terahertz wavelength is emitted from the edge surface of the active layer 24 along an optical axis 62.

Next, the light intensity distribution and threshold electric current calculated by a simulation will be described as a specific example. The substrate 10 includes InP or GaAs, and the light-emitting quantum well regions 80 are well layers including $In_xGa_{1-x}As$ (0<x<1), and barrier layers including $In_yAl_{1-y}As$ (0<y<1). Furthermore, the optical guide layer 25 includes $In_zGa_{1-z}As$ (0<z<1).

Figure 4A:
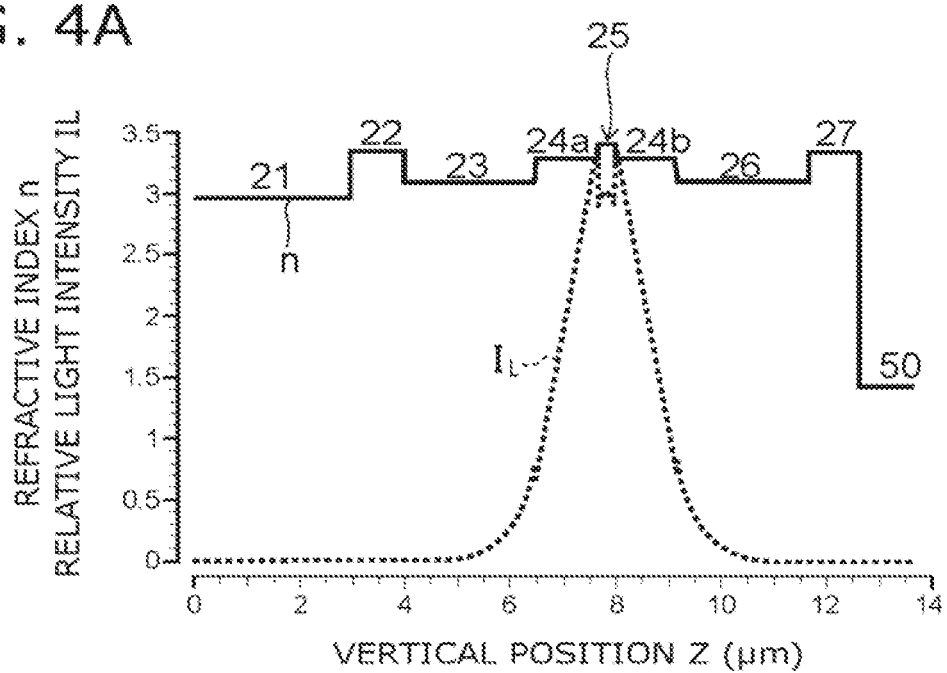
FIG. 4A is a graph showing the simulation results of relative light intensity distribution in a first specific example of the first embodiment.
Figure 4B:
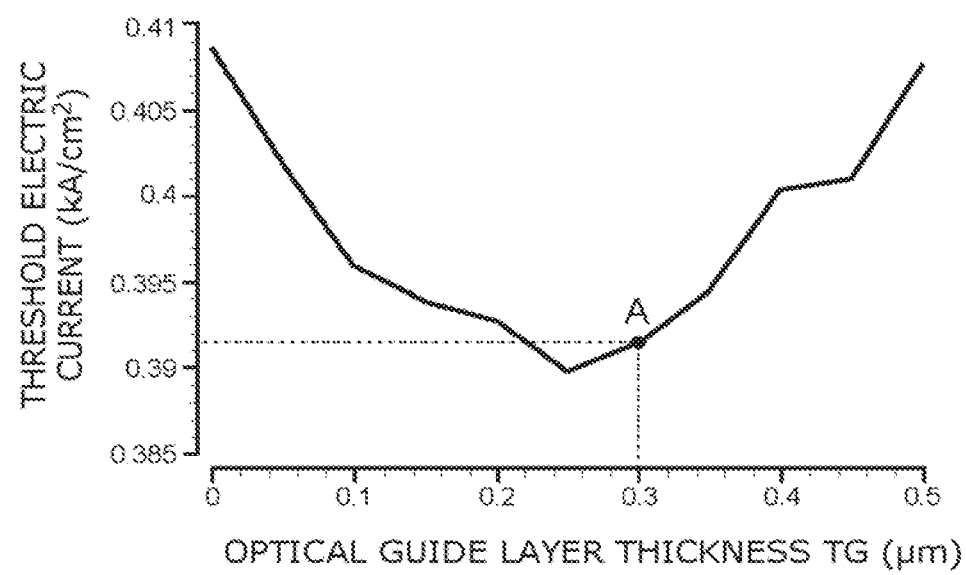
FIG. 4B is a graph showing the simulation results of threshold electric current dependency with respect to the thickness of an optical guide layer.

FIG. 4A is a graph showing the simulation results of relative light intensity distribution in a first specific example of the first embodiment, and FIG. 4B is a graph showing the simulation results of threshold electric current dependency with respect to the thickness of the optical guide layer.

In FIG. 4A, the vertical axis is the refractive index (solid line) n or light intensity (broken line) $I_L$, and the horizontal axis is the vertical position Z.

(Table 1) shows the unit stacked body 100 of the first specific example.

TABLE 1

| Reference Numeral | Layer | Composition | Thickness (μm) | Doping (×10$^{17}$cm$^{-2}$) | Refractive index |
|---|---|---|---|---|---|
| 21 | Foundation Layer | InP | 3 | 30 | 2.967 + j1.515E−02 |
| 22 | Contact Layer | In$_{0.532}$Ga$_{0.468}$As | 1 | 10 | 3.336 + j7.9E−03 |
| 23 | Cladding Layer | InP | 2.5 | 0.4 | 3.089 + j1.94E−04 |
| 24a | Active layer | InGaAs/InAlAs | 1.1895 | 0.1 | 3.263 + j1.199E−04 |
| 25 | Optical Guide Layer | In$_{0.532}$Ga$_{0.468}$As | 0.3 | 0 | 3.402 |
| 24b | Active layer | InGaAs/InAlAs | 1.1895 | 0.1 | 3.263 + j1.199E−04 |
| 26 | Cladding Layer | InP | 2.5 | 0.4 | 3.089 + j1.94E−04 |
| 27 | Contact Layer | In$_{0.532}$Ga$_{0.468}$As | 1.0 | 10 | 3.336 + j7.9E−03 |
| 50 | Upper Electrode | Au | 1.0 | | 1.425 + j3.222E−01 |

The stacked body 20 has the foundation layer 21 including n-type InP (thickness: 3 μm, refractive index: 2.97), the contact layer 22 including n-type InGaAs (thickness: 1 μm, refractive index: 3.34), the first cladding layer 23 including n-type InP (thickness: 2.5 μm, refractive index: 3.09), the active layer 24a (thickness: 1.19 μm, refractive index: 3.26), the optical guide layer 25 including InGaAs (thickness: 0.3 μm, refractive index: 3.4), the active layer 24b (thickness: 1.19 μm, refractive index: 3.26), the second cladding later 26 including n-type InP (thickness: 2.5 μm, refractive index: 3.09), and the contact layer 27 including n-type InGaAs (thickness: 1 μm, refractive index: 3.34), in this order from the side of the substrate 10. Note that the foundation layer 21 may be a portion of the substrate 10. Note that when configuring the contact layers 22 and 27, the optical guide layer 25, the active layers 24a and 24b, and the like by In$_x$Ga$_{1-x}$As (0<x<1), when the mole ratio x approaches 0.523, lattice match with InP becomes easier, and crystallinity becomes favorable.

As shown in FIG. 1B, the light-emitting quantum well regions 80 can have two or more well layers. For example, the well layer thickness TW of the thicker one is 4.5 nm or the like. The thickness TG of the optical guide layer 25 is 0.3 μm, and is sufficiently thicker than the well layer thickness TW. Therefore, optical transition between sub-bands does not occur in the optical guide layer 25. That is, the electron that is the carrier 102 is confined in a well layer of the light-emitting quantum well region 80. On the other hand, light is confined near the optical guide layer 25 having a refractive index higher than the effective refractive index of the light-emitting quantum well layers 80. If the well layer thickness TW is made to be 4.5 nm, the peak of gain is an infrared band such as near 3.7 μm or near 4.3 μm.

As shown in FIG. 4A, the spreading width (stacking direction) of the laser beam in which the light intensity I$_L$ is half of the peak value can be made narrow at approximately 1.8 μm. Therefore, as shown in point A of FIG. 4B, the threshold electric current can be made low at approximately 0.392 kA/cm$^2$. Because of this, the quantum efficiency and light output can be raised. Furthermore, warping may be introduced to the light-emitting quantum well regions 80. For example, the well layer can be made In$_{0.669}$Ga$_{0.331}$As (the lattice constant number is larger than InP), and the barrier layer can be made In$_{0.362}$Al$_{0.638}$As (the lattice constant number is smaller than InP), or the like. When done in this manner, for example, lattice mismatch is compensated for between the well layer and the barrier layer, so crystallinity can be maintained in a favorable manner, and the threshold electric current can be further reduced.

Figure 5:
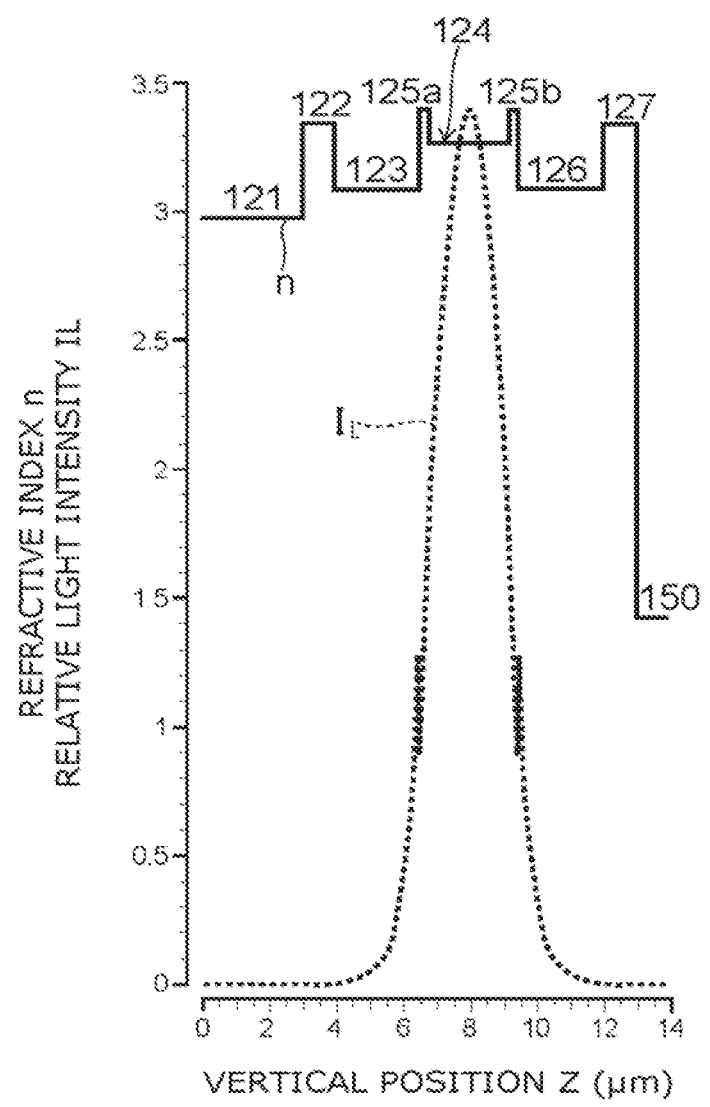
FIG. 5 is a graph showing the simulation results of relative light intensity distribution in a specific example of a second comparative example.

FIG. 5 is a graph showing the simulation results of relative light intensity distribution in the second comparative example.

In FIG. 5, the vertical axis is the refractive index (solid line) n or light intensity (broken line) I$_L$, and the horizontal axis is the position Z in the vertical direction.

(Table 2) shows the unit stacked body of the second comparative example.

TABLE 2

| Reference Numeral | Layer | Composition | Thickness (μm) | Doping (×10$^{17}$cm$^{-2}$) | Refractive index |
|---|---|---|---|---|---|
| 121 | Foundation Layer | InP | 3 | 30 | 2.967 + j1.515E−02 |
| 122 | Contact Layer | In$_{0.532}$Ga$_{0.468}$As | 1 | 10 | 3.336 + j7.9E−03 |
| 123 | Cladding Layer | InP | 2.5 | 0.4 | 3.089 + j1.94E−04 |
| 125a | Optical guide layer | | 0.3 | 1.0 | 3.395 + j7.764E−04 |
| 124 | Active layer | InGaAs/InAlAs | 2.38 | 0.1 | 3.263 + j1.199E−04 |
| 125b | Optical Guide Layer | In$_{0.532}$Ga$_{0.468}$As | 0.3 | 1.0 | 3.395 + j7.764E−04 |
| 126 | Cladding Layer | InP | 2.5 | 0.4 | 3.089 + j1.94E−04 |
| 127 | Contact Layer | In$_{0.532}$Ga$_{0.468}$As | 1.0 | 10 | 3.336 + j7.9E−03 |
| 150 | Upper Electrode | Au | 1.0 | | 1.425 + j3.222E−01 |

The stacked body includes a foundation layer 121 including n-type InP (thickness: 3 µm, refractive index: 2.97), a contact layer 122 made of n-type InGaAs (thickness: 1 µm, refractive index: 3.34), the first cladding layer 123 including n-type InP (thickness: 2.5 µm, refractive index: 3.09), a optical guide layer 125a (thickness: 0.3 µm, refractive index: 3.40), the active layer 124 (thickness: 2.38 µm, refractive index: 3.26), a optical guide layer 125b (thickness: 0.3 µm, refractive index: 3.40), the second cladding later 126 including n-type InP (thickness: 2.5 µm, refractive index: 3.09), and a contact layer 127 including n-type InGaAs (thickness: 1.0 µm, refractive index: 3.34), in this order from the side of the substrate.

The spreading width (stacking direction) of the laser beam in which the light intensity $I_L$ is half of the peak value becomes wide at approximately 2.29 µm. Because of this, the threshold electric current becomes large at approximately 0.498 kA/cm$^2$, and the quantum efficiency and light output are reduced lower than in the first specific example.

Figure 6A:
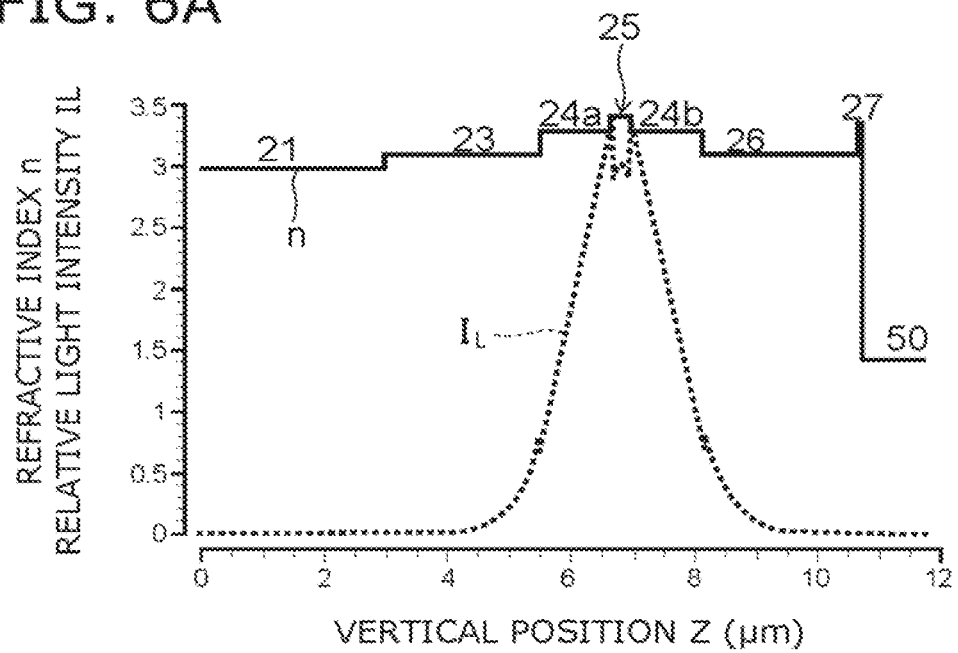
FIG. 6A is a graph showing the simulation results of relative light intensity distribution in a second specific example of the first embodiment.
Figure 6B:
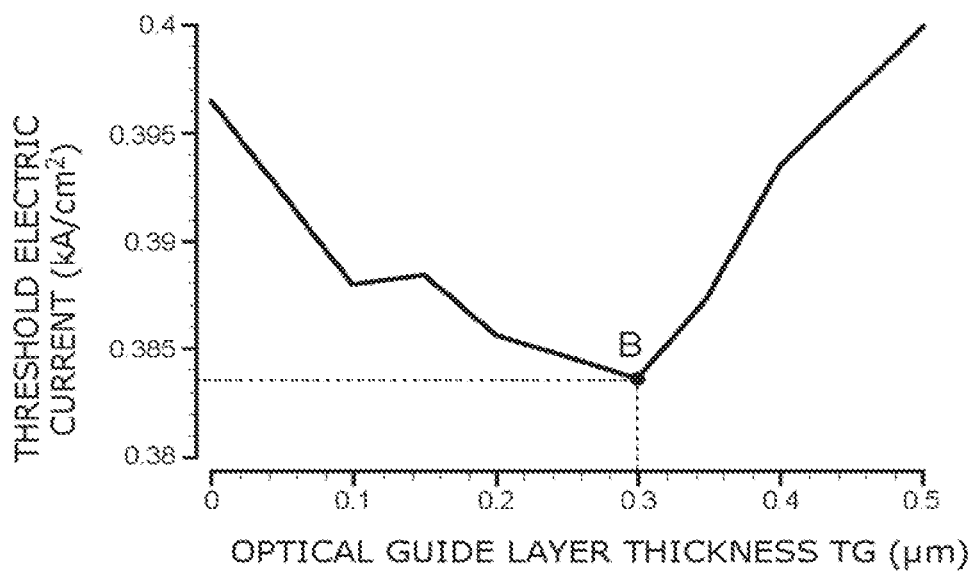
FIG. 6B is a graph showing the simulation results of threshold electric current dependency with respect to the thickness of an optical guide layer.

FIG. 6A is a graph showing the simulation results of relative light intensity distribution in the second specific example of the first embodiment, and FIG. 6B is a graph showing the simulation results of threshold electric current dependency with respect to the thickness of a optical guide layer.

In FIG. 6A, the vertical axis shows the refractive index (solid line) n or light intensity (broken line) $I_L$, and the horizontal axis shows the vertical position Z.

(Table 3) shows the unit stacked body 100 of the second specific example.

TABLE 3

| Reference Numeral | Layer | Composition | Thickness (µm) | Doping (×10$^{17}$cm$^{-2}$) | Refractive index |
|---|---|---|---|---|---|
| 21 | Foundation Layer | InP | 3 | 30 | 2.967 + j1.515E−02 |
| 23 | Cladding Layer | InP | 2.5 | 0.4 | 3.089 + j1.94E−04 |
| 24a | Active layer | InGaAs/InAlAs | 1.1895 | 0.1 | 3.263 + j1.199E−04 |
| 25 | Optical Guide Layer | In$_{0.532}$Ga$_{0.468}$As | 0.3 | 0 | 3.402 |
| 24b | Active layer | InGaAs/InAlAs | 1.1895 | 0.1 | 3.263 + j1.199E−04 |
| 26 | Cladding Layer | InP | 2.5 | 0.4 | 3.089 + j1.94E−04 |
| 27 | Contact Layer | In$_{0.532}$Ga$_{0.468}$As | 0.1 | 10 | 3.336 + j7.9E−03 |
| 50 | Upper Electrode | Au | 1.0 | | 1.425 + j3.222E−01 |

In the stacked body 20, the foundation layer 21 including n-type InP (thickness: 3 µm, refractive index: 2.97), the first cladding layer 23 including n-type InP (thickness: 2.5 µm, refractive index: 3.09), the active layer 24a (thickness: 1.19 µm, refractive index: 3.26), the optical guide layer 25 (thickness: 0.3 µm, refractive index: 3.4), the active layer 24b (thickness: 1.19 µm, refractive index: 3.26), the second cladding later 26 including n-type InP (thickness: 2.5 µm, refractive index: 3.09), and the contact layer 27 including n-type InGaAs (thickness: 0.1 µm, refractive index: 3.34), are disposed from the side of the substrate 10.

As shown in FIG. 6A, the spreading width (stacking direction) of the laser beam in which the light intensity $I_L$ is half of the peak value can be made narrow at approximately 1.8 µm. Therefore, as shown in point B of FIG. 6B, the threshold electric current can be made low at approximately 0.384 kA/cm$^2$. Because of this, the quantum efficiency and light output can be raised.

Figure 7A:
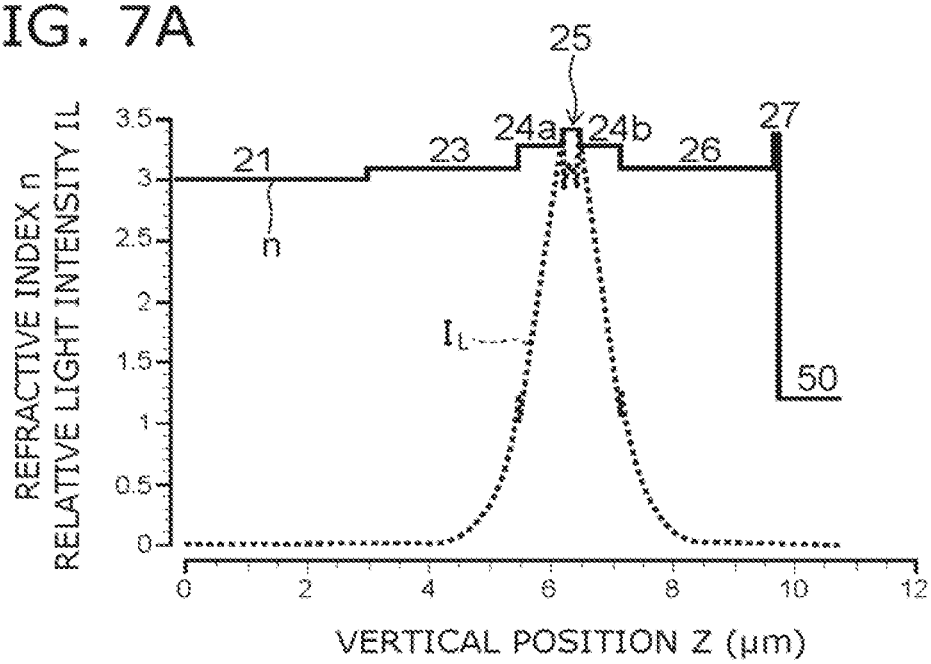
FIG. 7A is a graph showing the simulation results of relative light intensity distribution in a third specific example of the first embodiment.
Figure 7B:
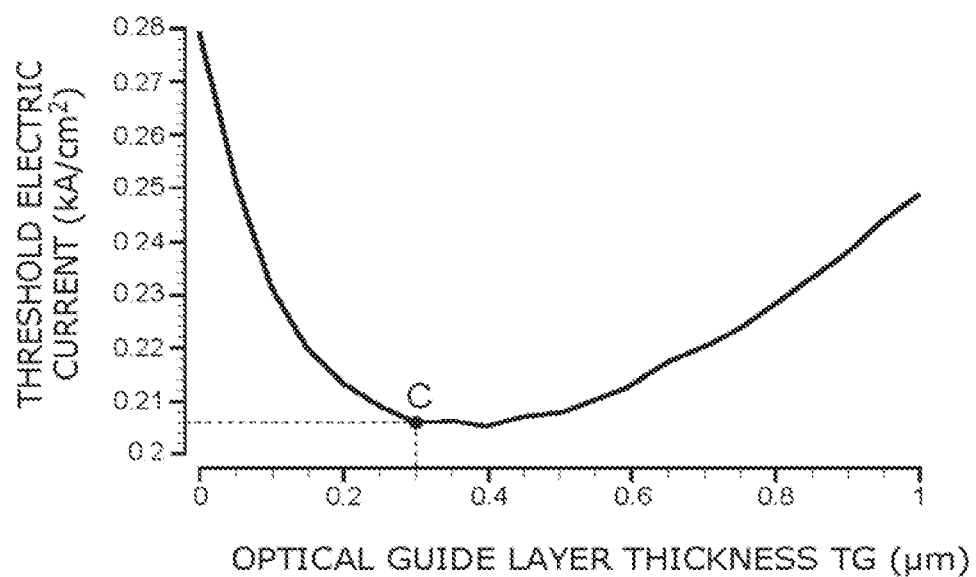
FIG. 7B is a graph showing the simulation results of threshold electric current dependency with respect to the thickness of an optical guide layer.

FIG. 7A is a graph showing the simulation results of relative light intensity distribution in a third specific example of the first embodiment, and FIG. 7B is a graph showing the simulation results of threshold electric current dependency with respect to the thickness of a optical guide layer.

In FIG. 7A, the vertical axis shows the refractive index (solid line) n or light intensity (broken line) $I_L$, and the horizontal axis shows the vertical position Z.

(Table 4) shows the unit stacked body of the third specific example 3.

TABLE 4

| Reference Numeral | Layer | Composition | Thickness (μm) | Doping (×10$^{17}$cm$^{-2}$) | Refractive index |
|---|---|---|---|---|---|
| 21 | Foundation Layer | InP | 3 | 30 | 2.967 + j1.515E−02 |
| 23 | Cladding Layer | InP | 2.5 | 0.4 | 3.089 + j1.94E−04 |
| 24a | Active layer | InGaAs/InAlAs | 0.6885 | 0.17 | 3.263 + j1.199E−04 |
| 25 | Optical Guide Layer | In$_{0.532}$Ga$_{0.468}$As | 0.3 | 0 | 3.402 |
| 24b | Active layer | InGaAs/InAlAs | 0.6885 | 0.17 | 3.263 + j1.199E−04 |
| 26 | Cladding Layer | InP | 2.5 | 0.4 | 3.089 + j1.94E−04 |
| 27 | Contact Layer | In$_{0.532}$Ga$_{0.468}$As | 0.1 | 10 | 3.336 + j7.9E−03 |
| 50 | Upper Electrode | Au | 1.0 | | 1.425 + j3.222E−01 |

The stacked body 20 includes the foundation layer 21 including n-type InP (thickness: 3 μm, refractive index: 2.97), the first cladding layer 23 including n-type InP (thickness: 2.5 μm, refractive index: 3.09), the active layer 24a (thickness: 0.69 μm, refractive index: 3.29), the optical guide layer 25 (thickness: 0.3 μm, refractive index: 3.42), the active layer 24b (thickness: 0.69 μm, refractive index: 3.29), the second cladding later 26 including n-type InP (thickness: 2.5 μm, refractive index: 3.09), and the contact layer 27 including n-type InGaAs (thickness: 0.1 μm, refractive index: 3.37) in this order from the side of the substrate 10.

As shown in FIG. 7A, the spreading width (stacking direction) of the laser beam in which the light intensity $I_L$ is half of the peak value can be made narrow at approximately 1.27 μm. Therefore, as shown in point C of FIG. 7B, the threshold electric current can be made low at approximately 0.206 kA/cm$^2$. Because of this, the quantum efficiency and light output can be raised.

According to the embodiment, a quantum cascade laser is provided having a lower threshold electric current. By making a low threshold electric current, the quantum efficiency or light output of a quantum cascade laser can be raised. These quantum cascade lasers can be widely used for gas analysis, environment measurement, detection of dangerous substances, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A quantum cascade laser comprising:
an active layer including a plurality of injection quantum well regions and a plurality of light-emitting quantum well regions, each of the plurality of injection quantum well regions and each of the plurality of light-emitting quantum well regions being alternatively stacked, the each of the plurality of light-emitting quantum well regions emitting laser light by optical transition between sub-bands of a carrier of an electron or a hole, and the each of the plurality of injection quantum well regions mitigating the carrier after the optical transition between sub-bands to a mini-band level, and injecting the carrier into a light-emitting quantum well region downstream, the active layer including a first portion and a second portion, a thickness of the first portion and a thickness of the second portion being the same;
a first and a second cladding layers sandwiching the active layer in a first stacking direction, and having a refractive index lower than an effective refractive index of each of the plurality of light-emitting quantum well regions;
a single optical guide layer interposed directly between the first portion and the second portion in the first stacking direction the first portion being directly adjacent to the first cladding layer, the second portion being directly adjacent to the second cladding layer, the single optical guide layer having a refractive index higher than the effective refractive index of each of the plurality of light-emitting quantum well regions, and having a thickness greater than thicknesses of all well layers of quantum well layers of each of the plurality of light-emitting quantum well regions;
a foundation layer disposed under the active layer, the first and the second cladding layers, and the single optical guide layer, the foundation layer having a refractive index lower than the effective refractive index of each of the plurality of light-emitting quantum well regions, the refractive index of the first and the second cladding layers, and the refractive index of the single optical guide layer;
an electrode disposed above the active layer, the first and the second cladding layers, the single optical guide layer, and the foundation layer, the electrode having a refractive index lower than the effective refractive index of each of the plurality of light-emitting quantum well regions, the refractive index of the first and the second cladding layers, the refractive index of the single optical guide layer, and the refractive index of the foundation layer;
a first dielectric layer having a first extension in the first stacking direction and a second extension in a second direction that is perpendicular to the first stacking direction, the first extension abutting the electrode, the active layer, the first and the second cladding layers, the single optical guide layer, and the foundation layer; and
a second dielectric layer having a first extension in the first stacking direction, a second extension in the second direction, and a third extension in the second direction, the first extension abutting the first extension of the first dielectric layer, the second extension abutting the second extension of the first dielectric layer, and the third extension abutting the first extension of the first dielectric layer.

2. The laser according to claim 1, further comprising a substrate, the first and the second cladding layers including a material that lattice-matches the substrate.

3. The laser according to claim 2, wherein the thickness of the single optical guide layer is 100 nm or greater and 500 nm or less.

4. The laser according to claim 1, wherein the thickness of the single optical guide layer is 100 nm or greater and 500 nm or less.

5. The laser according to claim 1, further comprising:
a substrate including InP, wherein
  each of the plurality of light-emitting quantum well regions includes a well layer including $In_xGa_{1-x}As$, and a barrier layer including $In_yAl_{1-y}As$,
  the single optical guide layer includes $In_zGa_{1-z}As$, and
the first cladding layer and the second cladding layer include InP.

6. The laser according to claim 1, wherein the thickness of the first portion and the thickness of the second portion is 1.19 μm.

7. The laser according to claim 1, further comprising:
a first contact layer disposed between the foundation layer and the first cladding layer; and
a second contact layer disposed between the electrode and the second cladding layer,
wherein the first contact layer and the second contact layer both have a refractive index that is greater than the refractive index of the first and the second cladding layers.

* * * * *